(12) United States Patent
Cheng

(10) Patent No.: US 8,324,105 B2
(45) Date of Patent: Dec. 4, 2012

(54) STACKING METHOD AND STACKING CARRIER

(75) Inventor: Jui-Hung Cheng, Hsinchu County (TW)

(73) Assignee: Victory Gain Group Corporation, The Valley (AI)

( * ) Notice: Subject to any disclaimer, the term of this patent is extended or adjusted under 35 U.S.C. 154(b) by 126 days.

(21) Appl. No.: 12/855,765

(22) Filed: Aug. 13, 2010

(65) Prior Publication Data

US 2012/0038060 A1    Feb. 16, 2012

(51) Int. Cl.
*H01L 21/00* (2006.01)

(52) U.S. Cl. .... 438/689; 438/690; 438/691; 156/345.21

(58) Field of Classification Search ............. 156/345.21, 156/345.35, 345.12; 438/689, 690, 691, 438/692; 257/666, 669

See application file for complete search history.

(56) References Cited

U.S. PATENT DOCUMENTS

| 6,117,778 | A  | * | 9/2000  | Jones et al. ................... 438/692 |
| 6,964,724 | B2 | * | 11/2005 | Yamasaki et al. ........ 156/345.21 |
| 7,462,551 | B2 | * | 12/2008 | Kulkarni et al. .............. 438/455 |
| 7,883,991 | B1 | * | 2/2011  | Wu et al. ....................... 438/459 |
| 2005/0257889 | A1 | * | 11/2005 | Yamasaki et al. ........ 156/345.17 |
| 2006/0292887 | A1 | * | 12/2006 | Hara ............................. 438/753 |

* cited by examiner

*Primary Examiner* — Long Pham
*Assistant Examiner* — Steven Rao
(74) *Attorney, Agent, or Firm* — Chun-Ming Shih

(57) ABSTRACT

A stacking carrier and a stacking method are provided. The stacking method is used between a wafer and a stacking carrier having the same shape. The stacking method includes the following steps. Firstly, an adhesive layer is coated on a surface of the carrier. Then, the adhesive layer corresponding to an edge of the carrier is partially removed, thereby defining at least one adhesive layer indentation. Afterwards, the wafer is stacked on the carrier through the adhesive layer having the adhesive layer indentation.

10 Claims, 3 Drawing Sheets

STACKING METHOD AND STACKING CARRIER

FIELD OF THE INVENTION

The present invention relates to a stacking method and a stacking carrier, and more particularly to a method for stacking a silicon wafer and a carrier and a stacking carrier applied to a wafer.

BACKGROUND OF THE INVENTION

Recently, the trends of fabricating integrated circuit (IC) chips are toward a three-dimensional stacking technology. In other words, the three-dimensional stacking technology is very potential. By means of the three-dimensional stacking technology, chips with different functions and on different substrates may be individually produced by proper fabricating processes and then combined together in a three-dimensional stacking manner. As such, the metallic wire length is shortened and the wire connection resistance is reduced to comply with the miniaturizing and power-saving requirements.

FIGS. 1A, 1B and 1C are schematic views illustrating a process of stacking an integrated circuit (IC) wafer on a carrier having the same shape according to the prior art. The integrated circuit wafer is attachable on the carrier according to a three-dimensional stacking technology. The common carrier is for example a glass substrate or a semiconductor substrate. As shown in FIG. 1A, an adhesive layer 12 is formed on a carrier by spin-coating an adhesive. Due to the cohesion of the adhesive, a thicker hump 120 is formed at the edge of the carrier 11. For enhancing the efficacy of bonding the carrier 11 and the wafer 10, the hump 120 at the edge of the carrier 11 is removed by solvent. As such, the adhesive layer 12 on the carrier 11 has better uniformity (see FIG. 1B). After the hump 120 at the edge of the carrier 11 is removed, a gap 13 is formed between the carrier 11 and the wafer 10 (see FIG. 1C). In this situation, the wafer 10 fails to be properly supported, and thus the edge of the wafer 10 is readily broken. The broken part of the wafer 10 results in contamination. The problem becomes more serious as the wafer 10 becomes thinner and thinner.

Therefore, there is a need of providing improved stacking method and carrier in order to obviate the drawbacks encountered from the prior art.

SUMMARY OF THE INVENTION

An object of the present invention provides a stacking method for use between a wafer and a carrier having the same shape in order to avoid the problem of causing contamination from the broken wafer edge.

Another object of the present invention provides a stacking carrier applied to a wafer having the same shape in order to avoid the problem of causing contamination from the broken wafer edge.

In accordance with an aspect of the present invention, there is provided a stacking method. The stacking method includes the following steps. Firstly, an adhesive layer is coated on a surface of the carrier. Then, the adhesive layer corresponding to an edge of the carrier is partially removed, thereby defining at least one adhesive layer indentation. Afterwards, the wafer is stacked on the carrier through the adhesive layer having the adhesive layer indentation.

In accordance with another aspect of the present invention, there is provided a stacking carrier. The stacking carrier includes a carrier body, an adhesive layer and at least one adhesive layer indentation. The adhesive layer overlies the carrier body for providing adhesion required to stack the wafer on the carrier body. The at least one adhesive layer indentation is formed at an edge of the adhesive layer.

In an embodiment, the adhesive layer is formed by spin-coating a photosensing material on a surface of the carrier. In addition, the at least one adhesive layer indentation is defined by performing a photolithography and etching procedure to partially remove the adhesive layer corresponding to the edge of the carrier.

In an embodiment, the at least one adhesive layer indentation includes a plurality of circular indentations, which are separated from each other. Alternatively, the at least one adhesive layer indentation includes a plurality of saw-toothed, which are in communication with each other to collectively form an indentation band.

In an embodiment, the carrier body is a glass substrate or a semiconductor substrate, and the wafer is a semiconductor wafer.

In an embodiment, a thicker hump is formed at an edge of the carrier body.

In accordance with the present invention, the wafer is stacked on the carrier through the use of an adhesive layer having at least one adhesive layer indentation. As a consequence, the attaching efficacy of stacking the wafer on the carrier is enhanced.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
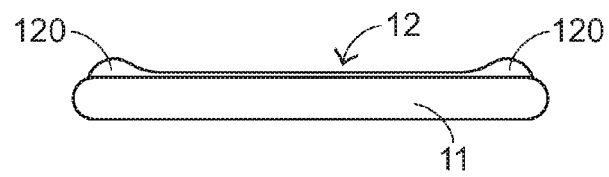
FIGS. 1A, 1B and 1C are schematic views illustrating a process of stacking an integrated circuit (IC) wafer on a carrier having the same shape according to the prior art.
Figure 1B:
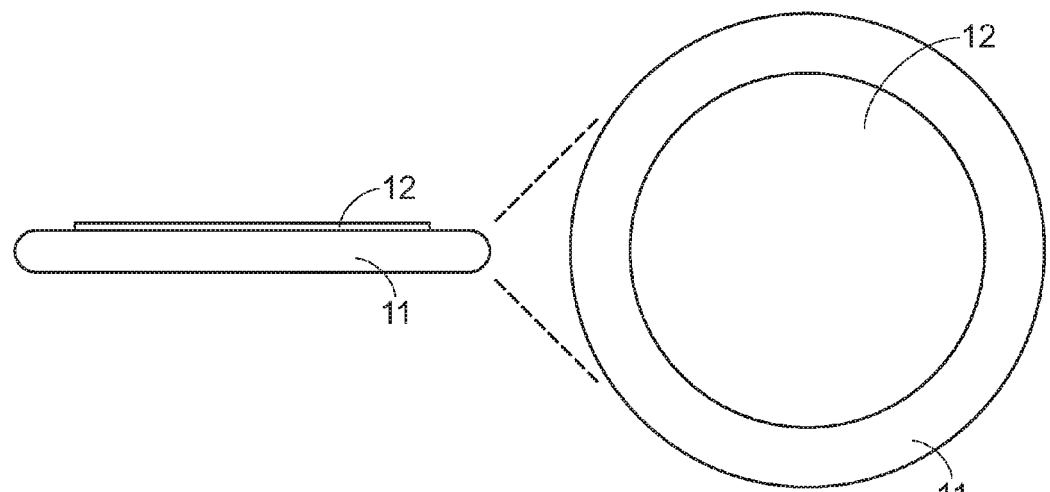
Figure 1C:
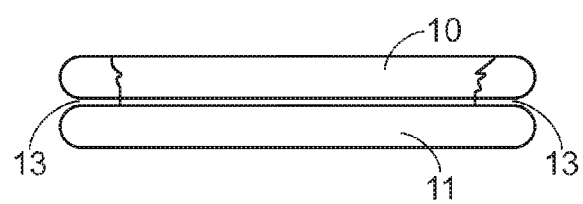
Figure 2A:
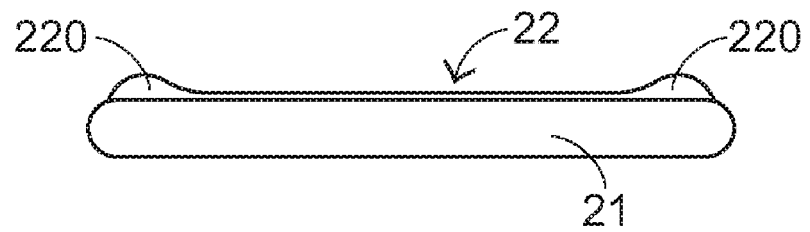
FIGS. 2A, 2B and 2C are schematic views illustrating a process of stacking an integrated circuit wafer on a carrier having the same shape according to an embodiment of the present invention.
Figure 2B:
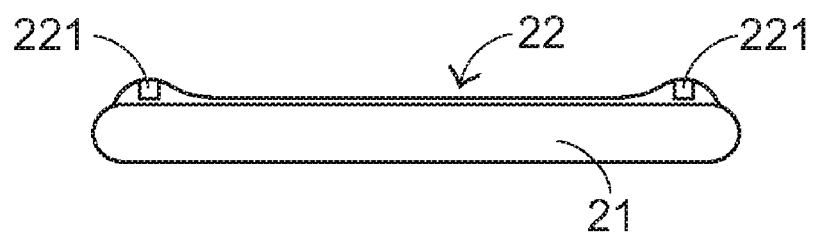
Figure 2C:
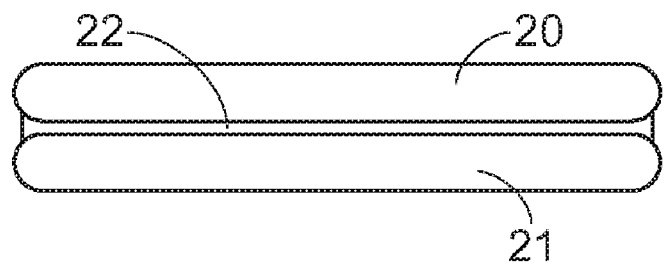

FIGS. 2A, 2B and 2C are schematic views illustrating a process of stacking an integrated circuit wafer on a carrier having the same shape according to an embodiment of the present invention. The integrated circuit wafer 20 is attachable on the carrier 21 according to a three-dimensional stacking technology. An example of the carrier 21 includes but is not limited to a glass substrate or a semiconductor substrate. An example of the wafer 20 is a semiconductor wafer such as a silicon wafer. As shown in FIG. 2A, an adhesive layer 22 is formed on a carrier by spin-coating an adhesive. Due to the cohesion of the adhesive, a thicker hump 220 is formed at the edge of the carrier 21. For avoiding generation of the gap between the carrier 21 and the wafer 20 after the wafer 20 is placed on the carrier 21, the adhesive layer 22 at the edge of the carrier 21 is partially removed, so that at least one adhesive layer adhesive layer indentation 221 is defined at the edge of the carrier 21 (see FIG. 2B). Next, the wafer 20 is stacked on the carrier 21 through the adhesive layer 22. In response to an external force exerted on the wafer 20, the edge hump 220 is squeezed and filled into the nearby adhesive layer adhesive layer indentation 221. The combination of wafer 20 and the carrier 21 is shown in FIG. 2C. In accordance with the stacking method of the present invention, the problem of generating the gap in the prior art will be avoided. As a consequence, the possibility of causing contamination from the broken wafer edge will be minimized.

Figure 3A:
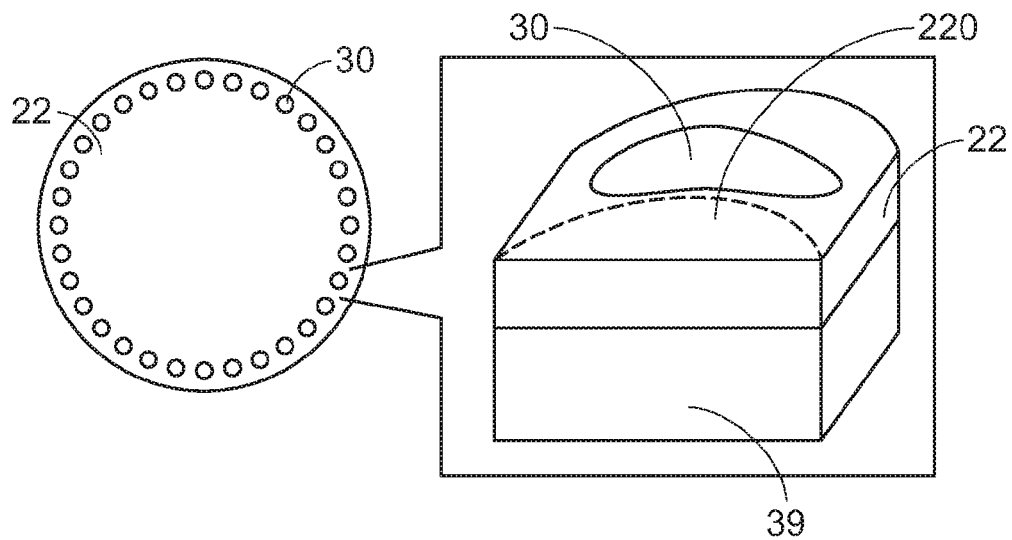
FIGS. 3A and 3B are schematic views illustrating a process of defining the adhesive layer indentation at the edge of the carrier according to the present invention.
Figure 3B:
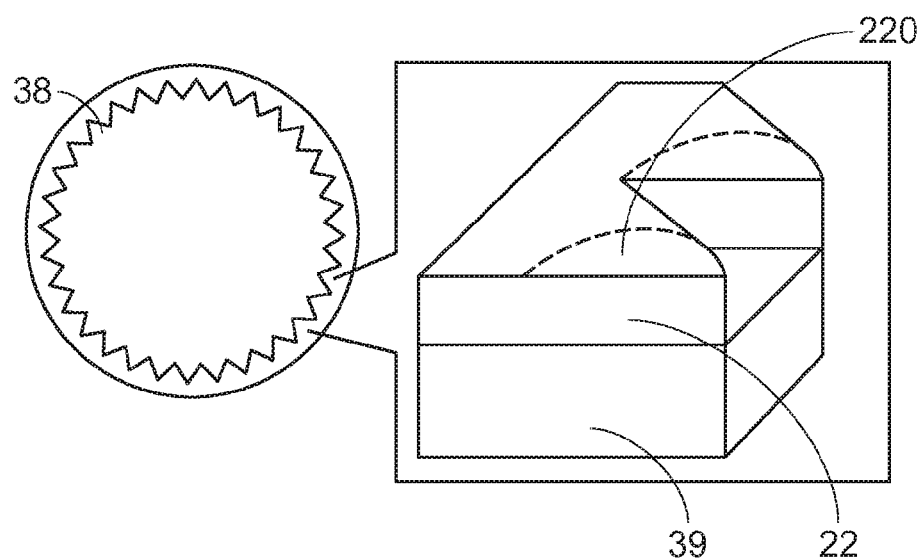

FIGS. 3A and 3B are schematic views illustrating the configurations of two exemplary adhesive layer indentations defined at the edge of the carrier according to the present invention. As shown in FIG. 3A, the edge of the adhesive layer 22 has a plurality of circular indentations 30, which are separated from each other. The circular indentations 30 may run through the adhesive layer 22 to expose the underlying carrier body 39. Alternatively, the circular indentations 30 do not run through the adhesive layer 22, and thus the underlying carrier body 39 is not exposed. The depth of the circular indentation 30 is not restricted as long as the circular indentation 30 could provide a space for filling the edge hump 220. As shown in FIG. 3B, the edge of the adhesive layer 22 has a plurality of saw-toothed indentations 31, which are in communication with each other to collectively form an adhesive layer indentation band 38. Similarly, these saw-toothed indentations 31 may run through the adhesive layer 22 to expose the underlying carrier body 39. Alternatively, the saw-toothed indentations 31 do not run through the adhesive layer 22, and thus the underlying carrier body 39 is not exposed. The depth of the saw-toothed indentations 31 is not restricted as long as the circular indentation 30 could provide a space for filling the edge hump 220.

Moreover, the adhesive layer 22 is made of a photosensing material (e.g. liquid photoresist material or dry-film photoresist material such as polyimide). The above adhesive layer indentations may be formed by performing a photolithography and etching procedure on the photosensing material. Alternatively, the adhesive layer 22 may be made of a non-photosensing material, and other patterning procedure may be performed to define the adhesive layer indentations.

From the above description, the stacking method of the present invention is capable of avoiding generation of the gap between the carrier and the wafer. As a consequence, the possibility of causing contamination from the broken wafer edge will be minimized.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stacking method for use between a wafer and a carrier having the same shape, the stacking method comprising steps of:
coating an adhesive layer on a surface of the carrier, the adhesive layer being directly contacted with the carrier;
partially removing the adhesive layer corresponding to an edge of the carrier, thereby defining at least one adhesive layer indentation in the adhesive layer at the edge of the carrier; and
stacking the wafer on the carrier through the adhesive layer having the adhesive layer indentation.

2. The stacking method according to claim 1 wherein the adhesive layer is formed by spin-coating a photosensing material on a surface of the carrier, and the at least one adhesive layer indentation is defined by performing a photolithography and etching procedure to partially remove the adhesive layer corresponding to the edge of the carrier.

3. The stacking method according to claim 1 wherein the at least one adhesive layer indentation includes a plurality of circular indentations, which are separated from each other.

4. The stacking method according to claim 1 wherein the at least one adhesive layer indentation includes a plurality of saw-toothed, which are in communication with each other to collectively form an indentation band.

5. A stacking carrier applied to a wafer having the same shape, the stacking carrier comprising:
a carrier body;
an adhesive layer overlying the carrier body for providing adhesion required to stack the wafer on the carrier body, the adhesive layer being directly contacted with the carrier; and
at least one adhesive layer indentation formed in the adhesive layer at an edge of the carrier body.

6. The stacking carrier according to claim 5 wherein the carrier body is a glass substrate or a semiconductor substrate, and the wafer is a semiconductor wafer.

7. The stacking carrier according to claim 5 wherein a thicker hump is formed at an edge of the carrier body.

8. The stacking carrier according to claim 5 wherein the at least one adhesive layer indentation includes a plurality of circular indentations, which are separated from each other.

9. The stacking carrier according to claim 5 wherein the at least one adhesive layer indentation includes a plurality of saw-toothed, which are in communication with each other to collectively form an indentation band.

10. The stacking carrier according to claim 5 wherein the adhesive layer is formed by spin-coating a photosensing material on a surface of the carrier body.

* * * * *